US007695983B2

(12) United States Patent
Hoffman

(10) Patent No.: US 7,695,983 B2

(45) Date of Patent: Apr. 13, 2010

(54) INDEPENDENT CONTROL OF ION DENSITY, ION ENERGY DISTRIBUTION AND ION DISSOCIATION IN A PLASMA REACTOR

(75) Inventor: Daniel J. Hoffman, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1018 days.

(21) Appl. No.: 11/360,635

(22) Filed: Feb. 22, 2006

(65) Prior Publication Data

US 2007/0087455 A1 Apr. 19, 2007

Related U.S. Application Data

(60) Provisional application No. 60/728,178, filed on Oct. 18, 2005.

(51) Int. Cl.

| | |
|---|---|
| ***C23F 1/00*** | (2006.01) |
| ***C23C 16/00*** | (2006.01) |
| ***H01L 21/00*** | (2006.01) |
| ***G01L 21/30*** | (2006.01) |

(52) U.S. Cl. .................. 438/5; 118/723 I; 156/345.48; 156/345.49; 216/61; 216/67

(58) Field of Classification Search ...................... None

See application file for complete search history.

(56) References Cited

U.S. PATENT DOCUMENTS

| | | | |
|---|---|---|---|
| 4,579,618 A | 4/1986 | Celestino et al. | 156/345 |
| 4,585,516 A | 4/1986 | Corn et al. | 156/643 |
| 4,863,549 A | 9/1989 | Grunwald | 156/345 |
| 5,280,154 A | 1/1994 | Cuomo et al. | 219/121.52 |
| 5,368,685 A | 11/1994 | Kumihashi et al. | 216/70 |

(Continued)

FOREIGN PATENT DOCUMENTS

| | | |
|---|---|---|
| EP | 0553704 A1 | 8/1993 |

(Continued)

OTHER PUBLICATIONS

Kim, H.C., et al., “Analytic Model for a dual frequency capacitive discharge”, *Physics of Plasmas*, Nov. 2003, pp. 4545-4551, vol. 10, No. 11, American Institute of Physics, USA.

(Continued)

*Primary Examiner*—Allan Olsen

(74) *Attorney, Agent, or Firm*—The Law Office of Robert M. Wallace

(57) ABSTRACT

A method of processing a workpiece in a plasma reactor includes coupling RF power from at least three RF power source of three respective frequencies to plasma in the reactor, setting ion energy distribution shape by selecting a ratio between the power levels of a first pair of the at least three RF power sources, and setting ion dissociation and ion density by selecting a ratio between the power levels of a remaining one of the three RF power sources and an applied magnetic field. The three respective frequencies can be an LF frequency, an HF frequency and a VHF frequency, wherein the first pair corresponds to the LF and HF frequencies and the second pair corresponds to the HF and VHF frequencies.

6 Claims, 13 Drawing Sheets

Couple VHF Power, HF Power and LF Power to the Plasma and Apply a Low Frequency Magnetic Field to the Plasma — 368

Adjust Ion Energy Content by Selecting a Power Ratio Between the HF Power and the LF Power Generators — 369

Adjust Ion Dissociation Relative to Ion Density by Selecting a Power Ratio Between the Field Strength of the Magnetic Field and VHF Power — 370

Set the VHF, HF and LF Power Levels and the Magnetic Field Strength in Accordance with the Foregoing Selections — 371

U.S. PATENT DOCUMENTS

| Number | Kind | Date | Name | Class |
|---|---|---|---|---|
| 5,512,130 | A | 4/1996 | Barna et al. | 156/651.1 |
| 5,556,501 | A | 9/1996 | Collins et al. | 156/345 |
| 5,656,123 | A | 8/1997 | Salimian et al. | 156/345.43 |
| 5,779,926 | A * | 7/1998 | Ma et al. | 216/67 |
| 5,817,534 | A | 10/1998 | Ye et al. | 438/10 |
| 5,846,373 | A | 12/1998 | Pirkle et al. | 156/345.25 |
| 5,846,885 | A | 12/1998 | Kamata et al. | 438/729 |
| 5,888,414 | A * | 3/1999 | Collins et al. | 216/68 |
| 5,976,261 | A | 11/1999 | Moslehi et al. | 118/719 |
| 5,985,375 | A | 11/1999 | Donohoe et al. | 427/492 |
| 6,024,044 | A | 2/2000 | Law et al. | 118/723 E |
| 6,033,585 | A | 3/2000 | Wicker et al. | 216/68 |
| 6,077,384 | A | 6/2000 | Collins et al. | 156/345.29 |
| 6,089,181 | A | 7/2000 | Suemasa et al. | 118/723 |
| 6,110,287 | A | 8/2000 | Arai et al. | 118/723 |
| 6,113,731 | A | 9/2000 | Shan et al. | 156/345 |
| 6,126,778 | A | 10/2000 | Donohoe et al. | 156/345 |
| 6,190,496 | B1 | 2/2001 | DeOrnellas et al. | 156/345 |
| 6,193,855 | B1 | 2/2001 | Gopalraja et al. | 204/192.12 |
| 6,225,744 | B1 | 5/2001 | Tobin et al. | 315/111.51 |
| 6,227,141 | B1 | 5/2001 | Sharan et al. | 118/723 E |
| 6,252,354 | B1 | 6/2001 | Collins et al. | 315/111.51 |
| 6,270,617 | B1 | 8/2001 | Yin et al. | 156/345 |
| 6,309,978 | B1 | 10/2001 | Donohoe et al. | 438/710 |
| 6,312,556 | B1 | 11/2001 | Donohoe et al. | 156/345 |
| 6,354,240 | B1 | 3/2002 | DeOrnellas et al. | 118/723 |
| 6,388,382 | B1 | 5/2002 | Doi et al. | 315/111.51 |
| 6,395,641 | B2 | 5/2002 | Savas | 438/714 |
| 6,403,491 | B1 | 6/2002 | Liu et al. | 438/710 |
| 6,422,172 | B1 | 7/2002 | Tanaka et al. | 118/723 R |
| 6,444,084 | B1 | 9/2002 | Collins | 156/345 |
| 6,444,085 | B1 | 9/2002 | Collins et al. | 156/345 |
| 6,444,137 | B1 * | 9/2002 | Collins et al. | 216/79 |
| 6,454,898 | B1 | 9/2002 | Collins et al. | 156/345 |
| 6,462,482 | B1 | 10/2002 | Wickramanayaka et al. | 315/111.21 |
| 6,468,388 | B1 | 10/2002 | Hanawa et al. | 156/345.48 |
| 6,503,364 | B1 | 1/2003 | Masuda et al. | 156/345.24 |
| 6,589,437 | B1 | 7/2003 | Collins | 216/68 |
| 6,599,367 | B1 | 7/2003 | Nakatsuka | 118/715 |
| 6,641,661 | B1 | 11/2003 | Jardine et al. | 106/802 |
| 6,642,149 | B2 | 11/2003 | Suemasa et al. | 438/710 |
| 6,642,661 | B2 | 11/2003 | Strang | 315/111.21 |
| 6,656,273 | B1 | 12/2003 | Toshima et al. | 118/56 |
| 6,841,943 | B2 | 1/2005 | Vahedi et al. | 315/111.71 |
| 6,849,154 | B2 | 2/2005 | Nagahata et al. | 156/345.47 |
| 6,900,596 | B2 | 5/2005 | Yang et al. | 315/111.21 |
| 6,939,434 | B2 | 9/2005 | Collins et al. | 156/345.35 |
| 7,094,316 | B1 | 8/2006 | Hanawa et al. | 156/345.48 |
| 7,094,670 | B2 | 8/2006 | Collins et al. | 438/513 |
| 7,214,619 | B2 | 5/2007 | Brown et al. | 438/681 |
| 7,223,676 | B2 * | 5/2007 | Hanawa et al. | 438/515 |
| 7,264,688 | B1 | 9/2007 | Paterson et al. | 156/345.34 |
| 7,294,563 | B2 * | 11/2007 | Al-Bayati et al. | 438/513 |
| 7,393,765 | B2 * | 7/2008 | Hanawa et al. | 438/515 |
| 2001/0017109 | A1 * | 8/2001 | Liu et al. | 118/723 I |
| 2002/0039626 | A1 | 4/2002 | Nakahigashi et al. | 427/569 |
| 2002/0041160 | A1 | 4/2002 | Barnes et al. | 315/111.21 |
| 2002/0096259 | A1 | 7/2002 | Collins et al. | 156/345.48 |
| 2002/0159216 | A1 | 10/2002 | Ennis | 361/234 |
| 2003/0218427 | A1 | 11/2003 | Hoffman et al. | 315/11.41 |
| 2004/0154747 | A1 | 8/2004 | Ni et al. | 156/345.48 |
| 2004/0200417 | A1 * | 10/2004 | Hanawa et al. | 118/723 I |
| 2004/0224504 | A1 | 11/2004 | Gadgil | 438/680 |
| 2005/0022933 | A1 | 2/2005 | Howard | 156/345.47 |
| 2005/0039682 | A1 | 2/2005 | Dhindsa et al. | 118/723 |
| 2005/0051273 | A1 | 3/2005 | Maeda et al. | 156/345.48 |
| 2005/0082006 | A1 * | 4/2005 | Kaji et al. | 156/345.47 |
| 2005/0082256 | A1 | 4/2005 | Honda et al. | 216/67 |
| 2005/0136604 | A1 * | 6/2005 | Al-Bayati et al. | 438/301 |
| 2005/0161160 | A1 | 7/2005 | Tanabe et al. | 156/345.48 |
| 2005/0214478 | A1 * | 9/2005 | Hanawa et al. | 427/569 |
| 2005/0230047 | A1 | 10/2005 | Collins et al. | 156/345.33 |
| 2005/0241762 | A1 | 11/2005 | Paterson et al. | 156/345.28 |
| 2005/0255255 | A1 | 11/2005 | Kawamura et al. | 427/569 |
| 2006/0003603 | A1 | 1/2006 | Fukuchi | 438/787 |
| 2006/0019477 | A1 | 1/2006 | Hanawa et al. | 438/514 |
| 2006/0021701 | A1 | 2/2006 | Tobe et al. | 156/345.31 |
| 2006/0081558 | A1 | 4/2006 | Collins et al. | 216/67 |
| 2006/0144518 | A1 * | 7/2006 | Kaji et al. | 156/345.43 |
| 2006/0150913 | A1 | 7/2006 | Wang et al. | 118/723.01 R |
| 2006/0169582 | A1 | 8/2006 | Brown et al. | 204/298.01 |
| 2006/0175015 | A1 | 8/2006 | Chen et al. | 156/345.43 |
| 2007/0017897 | A1 | 1/2007 | Sinha et al. | 216/61 |
| 2007/0020937 | A1 | 1/2007 | Chen et al. | 156/345.48 |
| 2007/0031609 | A1 | 2/2007 | Kumar et al. | 427/569 |
| 2007/0084563 | A1 | 4/2007 | Holland | 455/426.1 |
| 2007/0087455 | A1 * | 4/2007 | Hoffman | 438/5 |
| 2007/0119546 | A1 | 5/2007 | Collins et al. | 156/345.48 |
| 2007/0212811 | A1 * | 9/2007 | Hanawa et al. | 438/104 |
| 2007/0218623 | A1 | 9/2007 | Chua et al. | 438/240 |
| 2007/0245958 | A1 | 10/2007 | Paterson et al. | 216/67 |
| 2007/0245959 | A1 | 10/2007 | Paterson et al. | 216/58 |
| 2007/0245960 | A1 | 10/2007 | Paterson et al. | 438/710 |
| 2007/0245961 | A1 | 10/2007 | Paterson et al. | 216/67 |
| 2007/0246161 | A1 | 10/2007 | Paterson et al. | 156/345.48 |
| 2007/0246162 | A1 | 10/2007 | Paterson et al. | 315/111.21 |
| 2007/0246163 | A1 | 10/2007 | Paterson et al. | 156/345.48 |
| 2007/0246443 | A1 | 10/2007 | Paterson et al. | 216/59 |
| 2007/0247073 | A1 | 10/2007 | Paterson et al. | 315/111.21 |
| 2007/0247074 | A1 | 10/2007 | Paterson et al. | 216/59 |
| 2008/0023443 | A1 | 1/2008 | Paterson et al. | 216/67 |
| 2008/0044960 | A1 * | 2/2008 | Al-Bayati et al. | 438/156 |

FOREIGN PATENT DOCUMENTS

| | | |
|---|---|---|
| JP | 2003-073836 | 3/2003 |
| WO | WO03043061 | 5/2003 |

OTHER PUBLICATIONS

"Radio Frequency"—Wikipedia.

Official Action Dated Aug. 14, 2009 in Co-Pending U.S. Appl. No. 11/410,780.

Official Action Dated Aug. 14, 2009 in Co-Pending U.S. Appl. No. 11/410,784.

Official Action Dated Aug. 25, 2009 in Co-Pending U.S. Appl. No. 11/337,153.

* cited by examiner

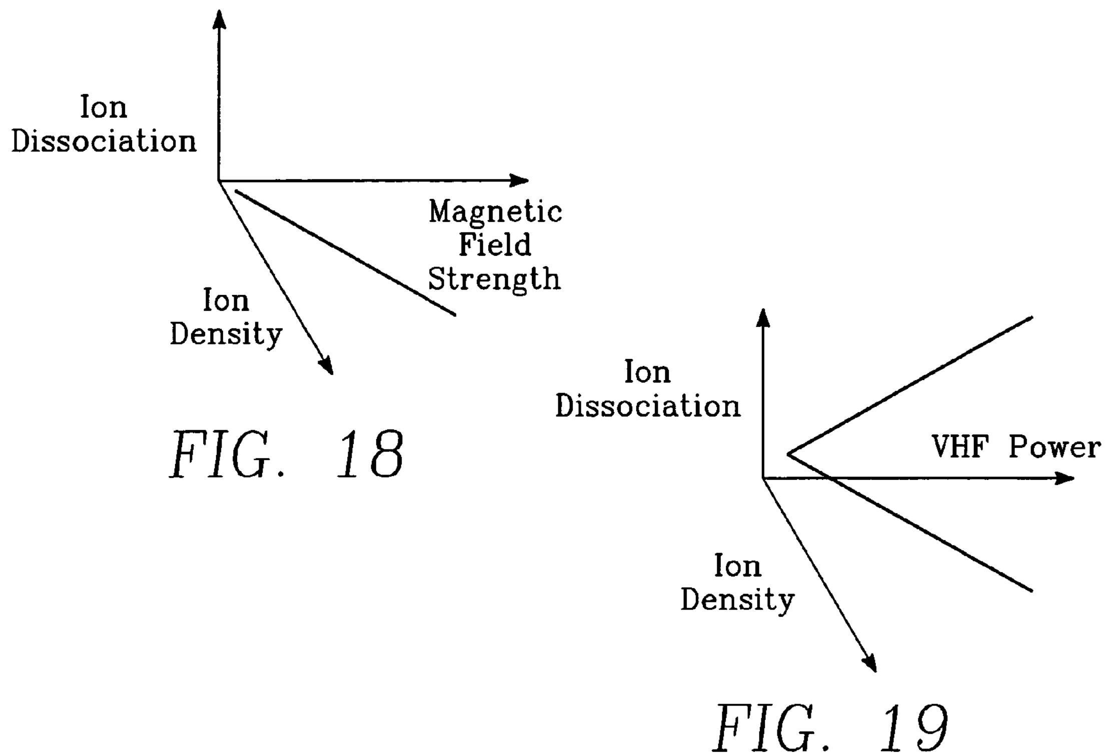
FIG. 18
FIG. 19
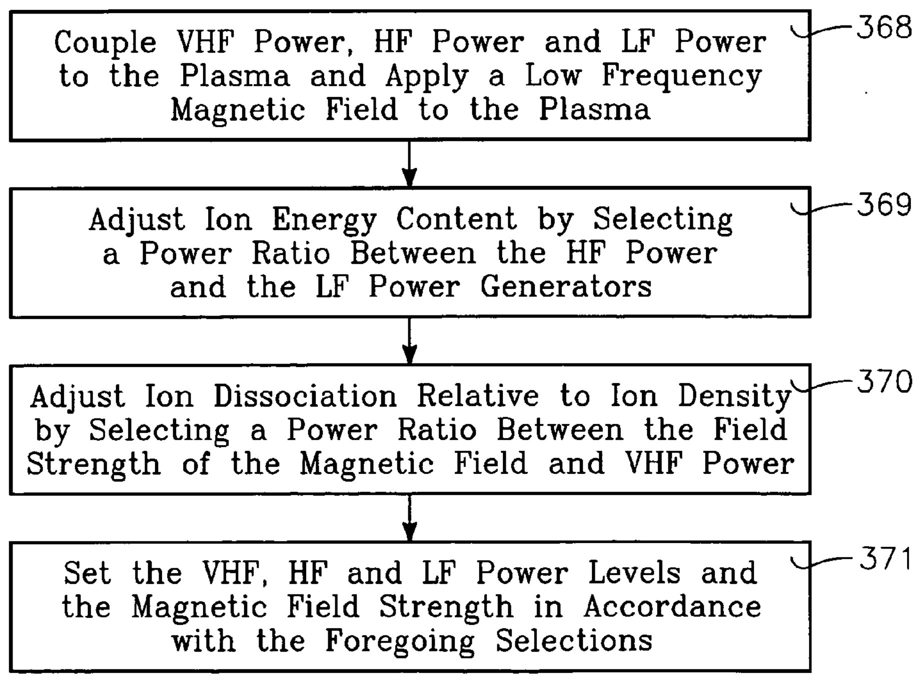
FIG. 20

INDEPENDENT CONTROL OF ION DENSITY, ION ENERGY DISTRIBUTION AND ION DISSOCIATION IN A PLASMA REACTOR

CROSS REFERENCE TO RELATED APPLICATIONS

This application claims the benefit of U.S. Provisional Application No. 60/728,178, filed Oct. 18, 2005.

BACKGROUND OF THE INVENTION

Technological advances in semiconductor device fabrication involve dramatic reduction in device feature size or critical dimension, so that openings formed between multiple insulated conductor layers, as one example, tend to be deeper and have greater aspect ratios. The present invention overcomes the difficulties in forming such structures by controlling the plasma ion density in the bulk plasma, the plasma ion energy distribution in the plasma sheath and the ion dissociation in the bulk plasma can independently and simultaneously. The present invention therefore fulfills the need to implement plasma processes in which the selections of ion density, ion energy distribution and ion dissociation are made without limiting one another.

SUMMARY OF THE INVENTION

A method of processing a workpiece in a plasma reactor includes coupling RF power from at least three RF power source of three respective frequencies to plasma in the reactor, setting ion energy distribution shape by selecting a ratio between the power levels of a first pair of the at least three RF power sources, and setting ion dissociation and ion density by selecting a ratio between the power levels of a remaining one of the three RF power sources and an applied magnetic field. The three respective frequencies can be an LF frequency, an HF frequency and a VHF frequency, wherein the first pair corresponds to the LF and HF frequencies and the second pair corresponds to the HF and VHF frequencies. Alternatively, the power sources comprise four RF power sources, and wherein the first pair corresponds to an HF frequency and an LF frequency and the second pair corresponds to a VHF frequency and another frequency. In one embodiment, the second pair corresponds to an upper VHF frequency and a lower VHF frequency. The other frequency may be coupled through an inductive source power applicator, a toroidal plasma source power applicator or a ceiling electrode. Or, all three frequencies may be coupled through a wafer support pedestal of the reactor.

BRIEF DESCRIPTION OF THE DRAWINGS

FIG. 18 is a three-dimensional graph depicting the simultaneous behaviors of ion density and ion dissociation as functions of magnetic field strength.

FIG. 19 is a three-dimensional graph depicting the simultaneous behaviors of ion density and ion dissociation as functions of VHF source power level.

FIG. 20 depicts a method of independently controlling ion energy distribution, ion density and ion dissociation using a pair of RF bias power sources, a VHF power source and a magnetic field.

DETAILED DESCRIPTION OF THE INVENTION

Figure 1:
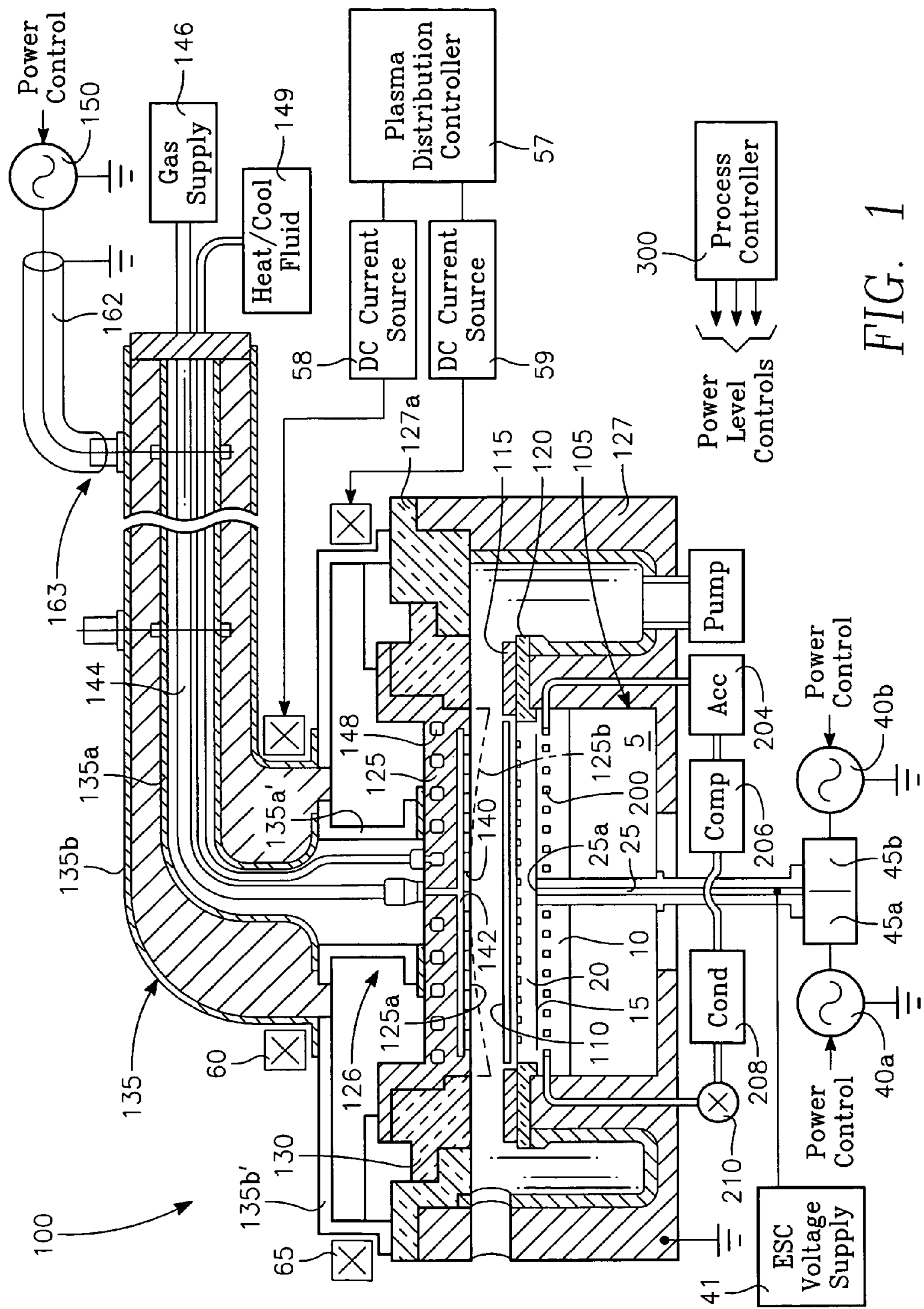
FIG. 1 illustrates a capacitively coupled plasma reactor with a plasma-resonant overhead electrode in which ion density, ion energy distribution and ion dissociation are independently controlled by separately adjusting LF and HF dual bias power levels and a VHF source power level.

Referring to FIG. 1, a capacitively coupled reactor chamber 100 encloses a wafer support pedestal 105 which may be an electrostatic chuck (ESC) upon which a semiconductor wafer 110 may be electrostatically clamped. The ESC includes an aluminum base layer 5 and an insulating layer or puck divided by a mesh or grid electrode 15 into a lower puck layer 10 and an upper puck layer 20. The edge of the chuck 105 may be enhanced with a dielectric ring 115 resting in the same plane as the wafer 110 supported on another dielectric ring 120. The ceiling of the chamber 100 is an overhead conductive electrode 125 supported on the chamber conductive sidewall 127 by an annular conductive ring 127*a* and a dielectric ring 130 that insulates the electrode 125, the rings 127*a*, 130 and the electrode 125 forming an electrode assembly 126. The bottom surface of the electrode 125 that faces the plasma may be a flat surface 125*a* or a curved surface 125*b* for enhancing uniformity of plasma ion distribution. RF source power from an RF generator 150 is coupled to the electrode 125 through an impedance matching stub 135 that functions as a fixed impedance match element. The stub 135 consists of inner and outer coaxial conductors 135*a*, 135*b*, the inner stub conductor 135*a* being connected to the electrode 125 through an inner conductive ring 135*a*' and the outer stub conductor 135*b* being connected to the grounded chamber sidewall ring 127*a* through and outer conductive ring 135*b*'.

The RF generator 150 is coupled to the stub via a 50-Ohm coaxial cable 162 at a tap point 163 along the length of the stub that is located to provide an impedance match. The inner and outer conductors of the cable 162 are connected to the stub inner and outer conductors 135*a*, 135*b*, respectively. RF bias power is applied through an RF feed conductor 25 to the ESC electrode 15 coupled to the RF feed conductor 25 at a feedpoint 25*a*. An ESC clamping voltage 41 source applies a D.C. wafer clamping voltage to the ESC electrode 15.

The overhead electrode 125 can be a gas distribution plate, in which case the electrode has plural gas injection orifices 140 with an internal gas manifold 142 coupled through a conduit 144 in the hollow interior of the stub 135 to a process gas supply 146. Similarly, thermal transfer (coolant/heating) fluid can be coupled to circulation passages 148 within the electrode 125 from a heating/cooling fluid source 149. The temperature of the electrostatic chuck (ESC) 105 can be controlled by a refrigeration loop that includes an internal evaporator 200 contained inside the ESC base 5 and external refrigeration components such as an accumulator 204, a compressor 206, a condenser 208 and an expansion valve 210.

Radial distribution of the plasma ion density is adjusted by inner and outer external magnetic coils 60, 65 driven with separately adjustable D.C. currents of current sources 58, 59 under control of a plasma distribution controller 57.

The impedance match space of the electrode-tuning stub combination 125, 135 is dramatically expanded if the reactance of the electrode 125 is matched to the reactance of plasma in the chamber 100 to form an electrode-plasma resonant frequency at or near the VHF frequency of the source power generator 150, and if the resonant frequency of the RF tuning stub 135 (determined by its length) is at or near this same frequency. The resulting expansion in impedance match space renders the reactor performance virtually impervious to fluctuating conditions in the plasma and electrical properties of the chamber interior surfaces.

A pair of RF generators 40*a*, 40*b* apply RF power through respective impedance match elements 45*a*, 45*b* to the RF feed conductor 25. The RF power output levels from the RF generators 150, 40*a*, 40*b* are independently controlled by a process controller 300. Preferably, the RF generator 40*a* has an RF output in the HF frequency range or just above the ion sheath transit frequency and sufficiently high to contribute to bulk ion density as well as sheath ion energy, which can be, for example, 13.56 MHz. The RF generator 40*b* preferably has an RF output in the LF frequency range, or just below the ion sheath transit frequency, which can be, for example, 2 MHz. The RF generator 150 is preferably a VHF frequency sufficiently high to contribute to both bulk ion density and ion dissociation with negligible or no contribution to ion energy. The process controller 300 adjusts ion energy, ion density and ion dissociation separately as follows: ion energy is adjusted with minimal impact on ion density and no impact upon ion dissociation by adjusting the ratio of the power levels of the LF and HF generators 40*b*, 40*a*; ion dissociation is adjusted relative to ion density with little or no impact upon ion energy by adjusting the ratio of the power levels of the HF and VHF generators 40*a*, 150. This permits the adjustment of the three parameters, ion energy, ion density, ion dissociation, in a separate manner. However, these adjustments are not completely independent because the VHF power level (the generator 40*a*) is involved in both the ion energy and ion density adjustments.

Complete independence in adjusting the three parameters (energy, density, dissociation) is achieved by introducing a controllable magnetic field to the plasma, which affects ion density exclusively. This feature, together with the LF, HF and VHF power sources 40*a*, 40*b*, 150, enables the density and dissociation to be adjusted independently of one another and independently of the ion energy. For this purpose, the reactor of FIG. 1 may be modified to include magnetic coils 501, 502, 503, 504 in orthogonal relationship having independent current inputs 501*a*, 502*a*, 503*a*, 504*a* controlled by a magnetic field current controller 505. The controller 505 may provide extremely low frequency currents (e.g., 10 Hz) to the inputs 501*a*, 502*a*, 503*a*, 504*a*, and these may be offset in phase from one another. In the presence of plasma RF source power (i.e., the VHF power applied by the VHF generator 150), the plasma ion density can be increased or decreased without significantly affecting the other parameters (or without affecting them at all) by increasing or decreasing the currents to the magnetic coils 501-504. If the VHF generator 150 has a sufficiently high frequency (e.g., 100-300 MHz or more), then it affects both the ion dissociation and ion density. These can therefore be adjusted together, with a separate independent adjustment of the density being performed by adjusting the magnetic field alone.

Figure 4:
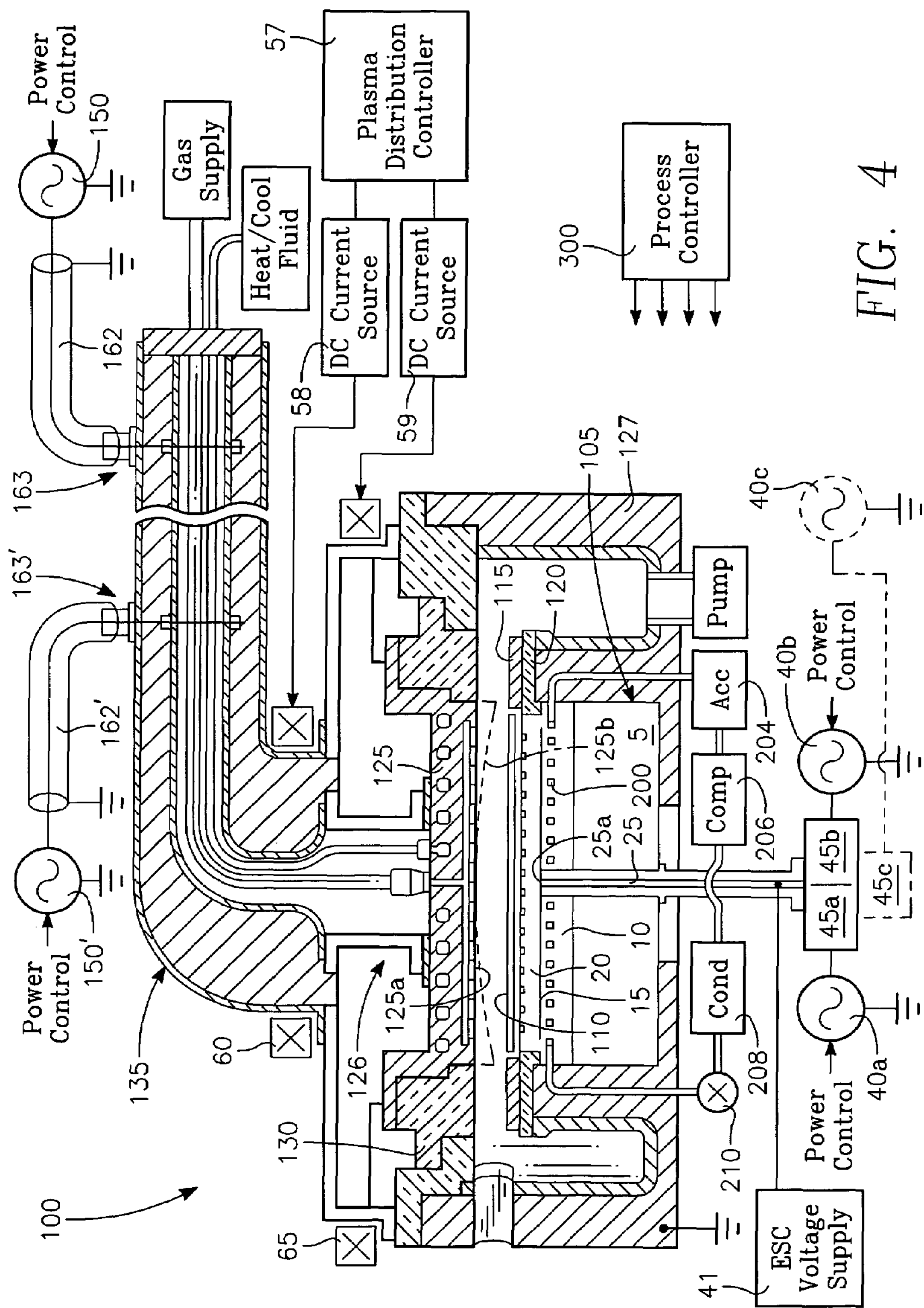
FIG. 4 illustrates an embodiment of FIG. 1 in which ion energy distribution is adjusted by controlling dual LF and HF bias power sources while ion density and ion dissociation are adjusted by controlling upper frequency and lower frequency VHF source power levels fed through a common fixed impedance match element.

In the embodiment of FIG. 4, the function of the magnetic field (to provide an independent adjustment of ion density) is performed, instead, by a second VHF frequency applied either to the overhead electrode 125 (from a VHF generator 150' shown in solid line) or to the ESC electrode 15 (from a VHF generator 40*c* shown in dashed line). This second VHF frequency is sufficiently below that of the first VHF generator 150 (e.g., below 300 MHz) so that its principal effect is upon ion density with very little or no effect upon ion dissociation (or at least less effect than that of the first VHF generator). For example, the upper VHF frequency of the first VHF generator 150 may be about 160 MHz while the lower VHF frequency of the second generator 150' (or 40*c*) may be about 60 MHz. If the second VHF generator 150' is employed for this purpose, then it may be coupled through the same impedance matching stub 135 as the first generator 150, but at a different tap point 163' that produces an impedance match at the different frequency of the second VHF generator 150'. The tap locations 163, 163' depicted in FIG. 4 are not shown to scale and their location and order may be different from that shown. If the second VHF frequency is applied to the ESC electrode 15, then the second VHF generator 40*c* is coupled to the RF feed rod 25 through an impedance match 45*c*. In this case, all three impedance match units 45*a*, 45*b*, 45*c* have their outputs connected to the RF feed conductor 25.

Figure 5:
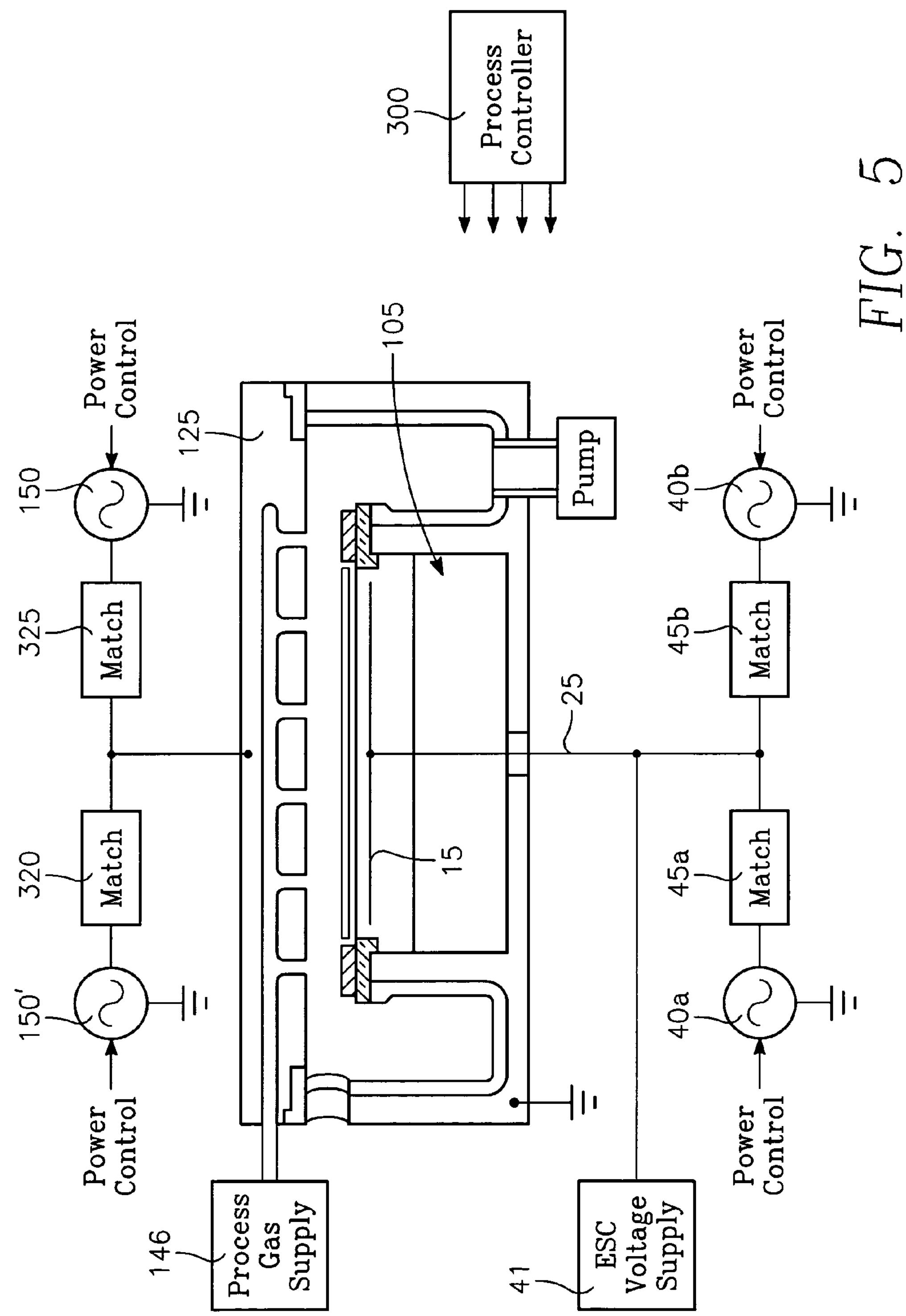
FIG. 5 illustrates a reactor in which ion energy distribution is adjusted by controlling dual LF and HF bias power sources while ion density and ion dissociation are adjusted by controlling upper frequency and lower frequency VHF source power levels through separate fixed impedance match elements.

While FIG. 4 shows how the two VHF frequencies may be applied to the overhead electrode 125 through a common impedance match element 135, FIG. 5 illustrates the case in which the two VHF generators are coupled to the electrode through different impedance match elements 320, 325.

In the embodiments of FIGS. 4 and 5, ion energy and ion energy distribution is adjusted by controlling the power levels of the LF and HF generators 40*a*, 40*b*, while ion density and ion dissociation are independently controlled by controlling the output power levels of the two VHF generators 150, 150' (or the two VHF generators 150, 40*c* in the alternative embodiment).

Figure 6:
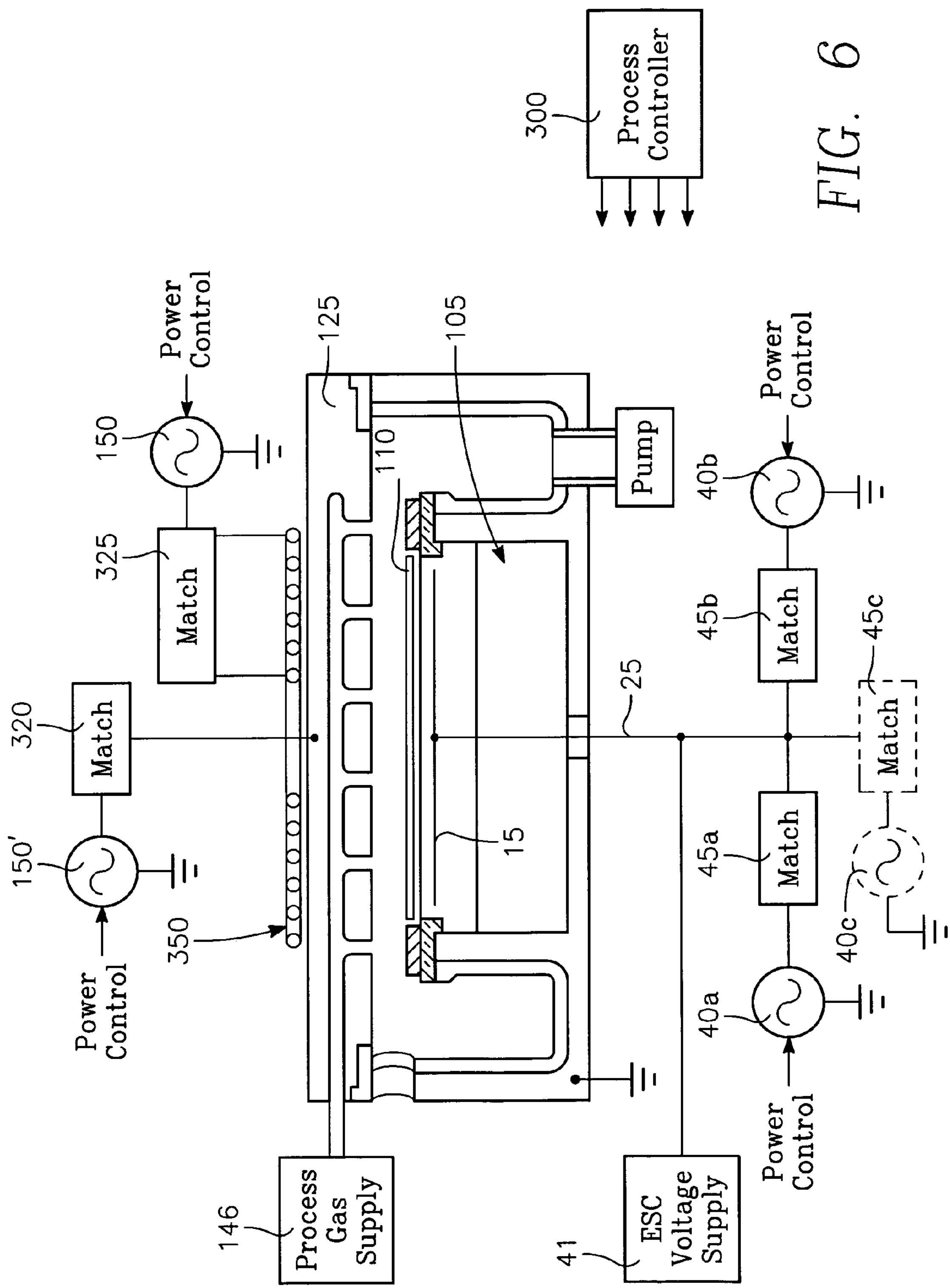
FIG. 6 illustrates a reactor in which ion energy distribution is adjusted by controlling dual LF and HF bias power sources while ion density and ion dissociation are adjusted by controlling a VHF source power level applied to the overhead electrode and RF source power level applied to an inductive RF power applicator or coil antenna.
Figure 7:
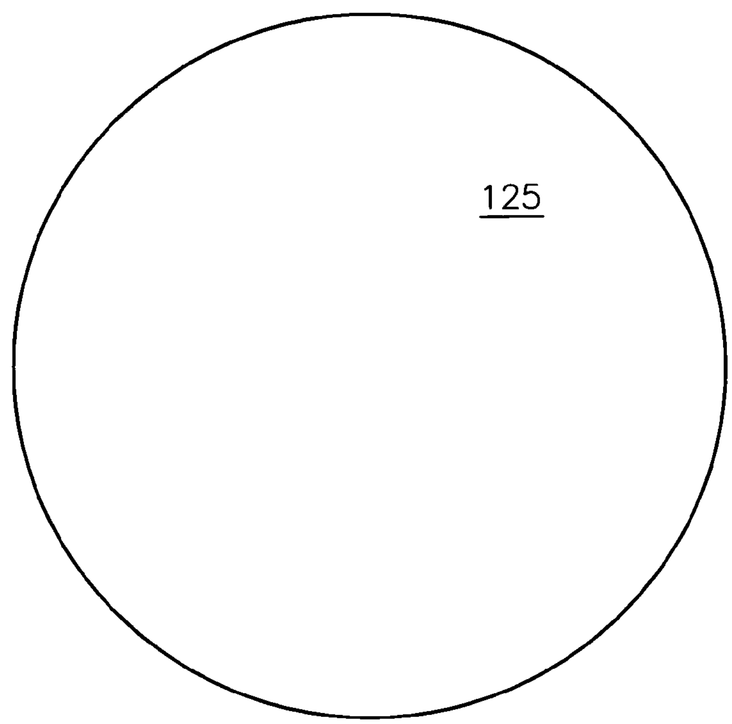
FIG. 7 depicts a first embodiment of the overhead electrode as a semiconductor electrode through which RF power can be inductively coupled.

FIG. 6 shows how the RF power controlling dissociation (i.e., from the generator 150) can be applied to an inductively coupled power applicator 350 (i.e., an overhead coil antenna) overlying the overhead electrode 125. This requires that the overhead electrode 125 be of a type that does not block inductively coupled RF power from the coil antenna 350. In order to permit inductive coupling of RF power through the electrode 125, the electrode may be a solid disc (FIG. 7) formed of a doped semiconductive material such as silicon, as disclosed in U.S. Pat. No. 6,444,084 to Kenneth Collins.

Figure 8:
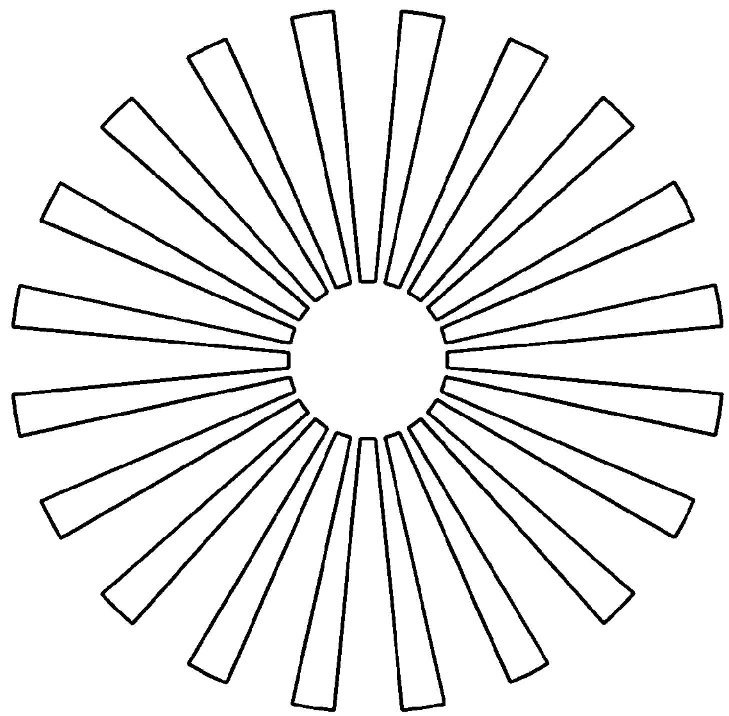
FIG. 8 depicts a second embodiment of the overhead electrode of the reactor of FIG. 6 as slotted electrode through which RF power can be inductively coupled.

Alternatively, the electrode 125 may have a slotted structure, as illustrated in FIG. 8, in order to enable RF power to be inductively coupled through the electrode 125. The RF frequency applied to the inductive coil antenna 350 need not necessarily be a VHF frequency, because even at lower frequencies an inductively coupled plasma exhibits a relatively high degree of dissociation. The frequency of the generator 150 in FIG. 6 may be an HF frequency or even an LF frequency and still have significant impact upon dissociation. As an alternative, the VHF generator 150' coupled to the overhead electrode may be replaced by a VHF generator 40*c* (of the same frequency) coupled through an impedance match 45*c* to the ESC RF feed conductor 25. In the embodiment of FIG. 6, ion energy and ion energy distribution is adjusted by controlling the power levels of the LF and HF generators 40*a*, 40*b*, while ion density and ion dissociation are independently controlled by controlling the output power levels of the two generators 150, 150' (or the two VHF generators 150, 40*c* in the alternative embodiment).

Figure 9:
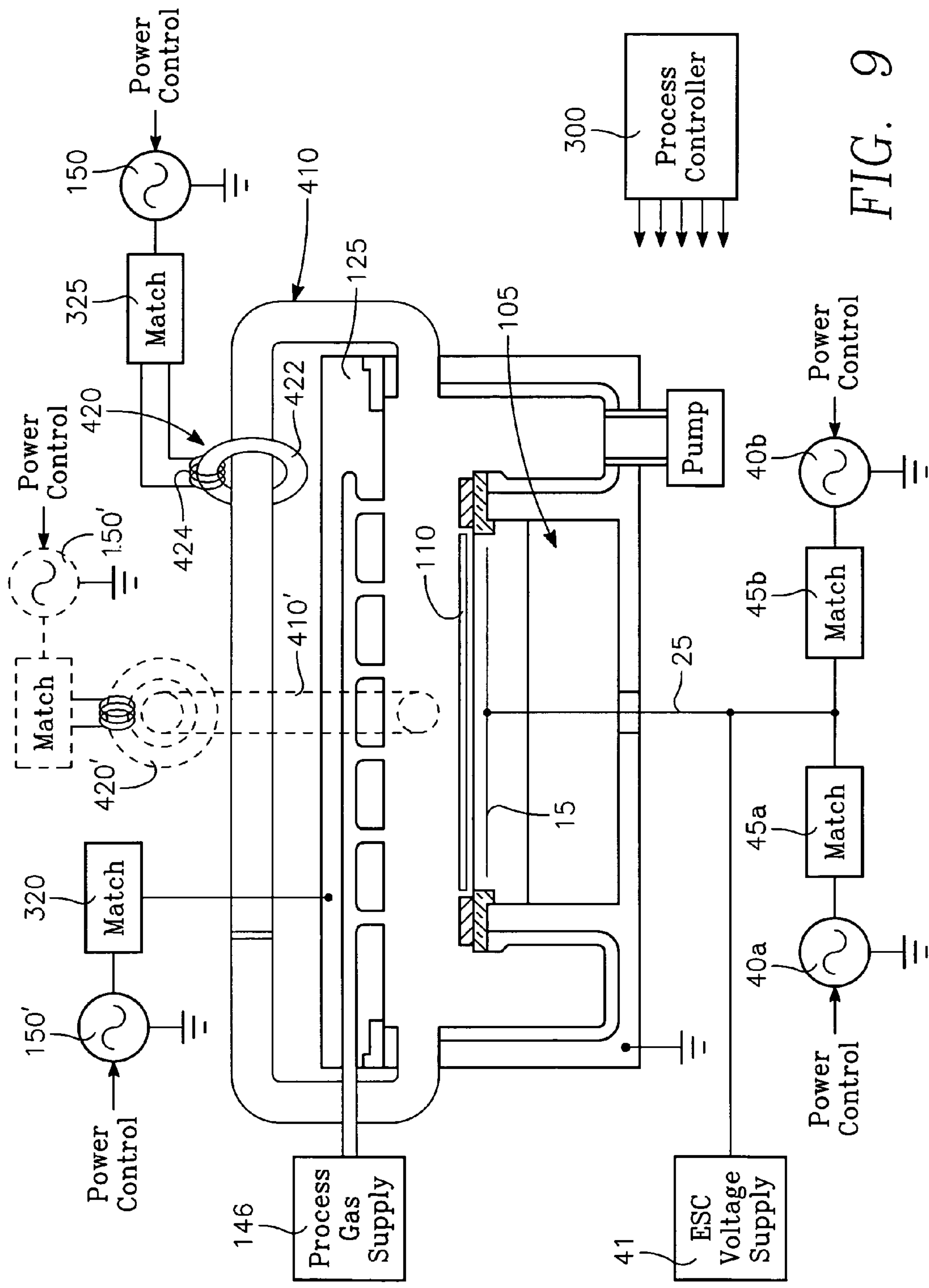
FIG. 9 depicts a reactor having a toroidal plasma source in which ion energy distribution is adjusted by controlling dual LF and HF bias power sources at the wafer while ion density and ion dissociation are adjusted by controlling a VHF source power level applied to the overhead electrode and RF source power level coupled through a reentrant conduit of the toroidal plasma source.

FIG. 9 illustrates an embodiment in which the coil antenna 350 is replaced by a toroidal RF power applicator 420 surrounding an external reentrant hollow conduit 410 that forms a toroidal plasma current path through the process region between the electrode 125 and the wafer 110. The external reentrant hollow conduit 410 and the toroidal RF power applicator 420 constitute a toroidal plasma source. The RF generator 150 is coupled through the impedance match element 325 to the toroidal RF power applicator 420. The toroidal RF power applicator 420 consists of a ring 422 formed of magnetic or magnetizable material (e.g., a magnetic core) and a conductive winding 424 wrapped around the ring and driven by the RF impedance match 325. As indicated in dashed line, a second (identical) hollow reentrant conduit 410' with a second toroidal RF power applicator 420' may be provided that is transverse to the first conduit 420. The conduit 410 accesses the chamber 100 at each end of the conduit through ports in the enclosure that lie on opposing sides of the process region formed between the wafer 110 and the electrode 125. This feature causes the toroidal plasma current to flow across the entire diameter of the wafer 110. The toroidal plasma current oscillates at the frequency of the RF power source 150. In the embodiment of FIG. 9, ion energy and ion energy distribution is adjusted by controlling the power levels of the LF and HF generators 40*a*, 40*b*, while ion density and ion dissociation are independently controlled by controlling the output power levels of the two generators 150, 150'.

Figure 10A:
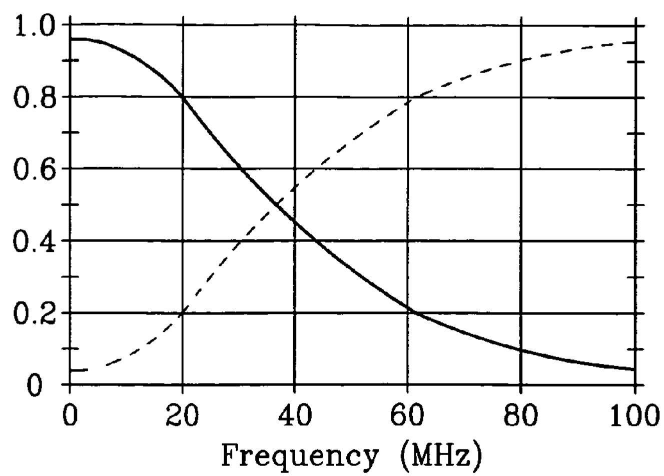
FIG. 10A is a graph comparing the RF power contributing to ion density with the power contributing to ion energy as a function of frequency.
Figure 10B:
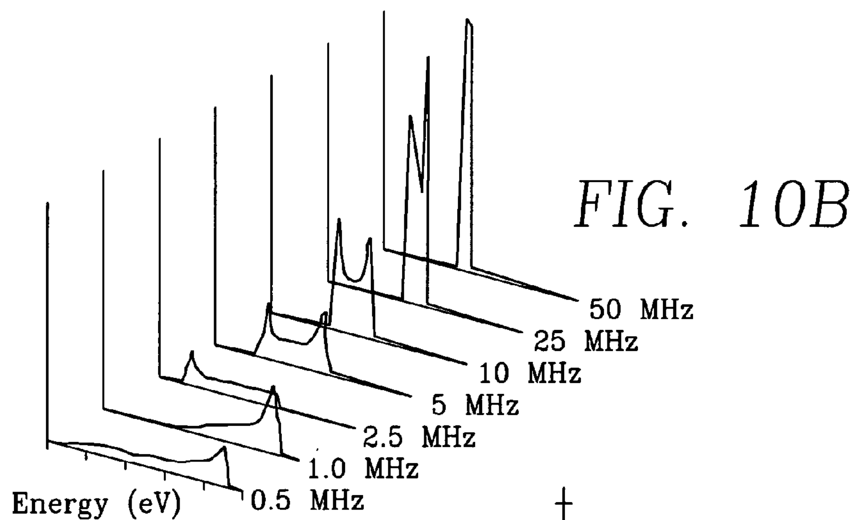
FIG. 10B is a graph comparing ion energy distributions obtained at different RF bias power frequencies for a single RF bias source.
Figure 10C:
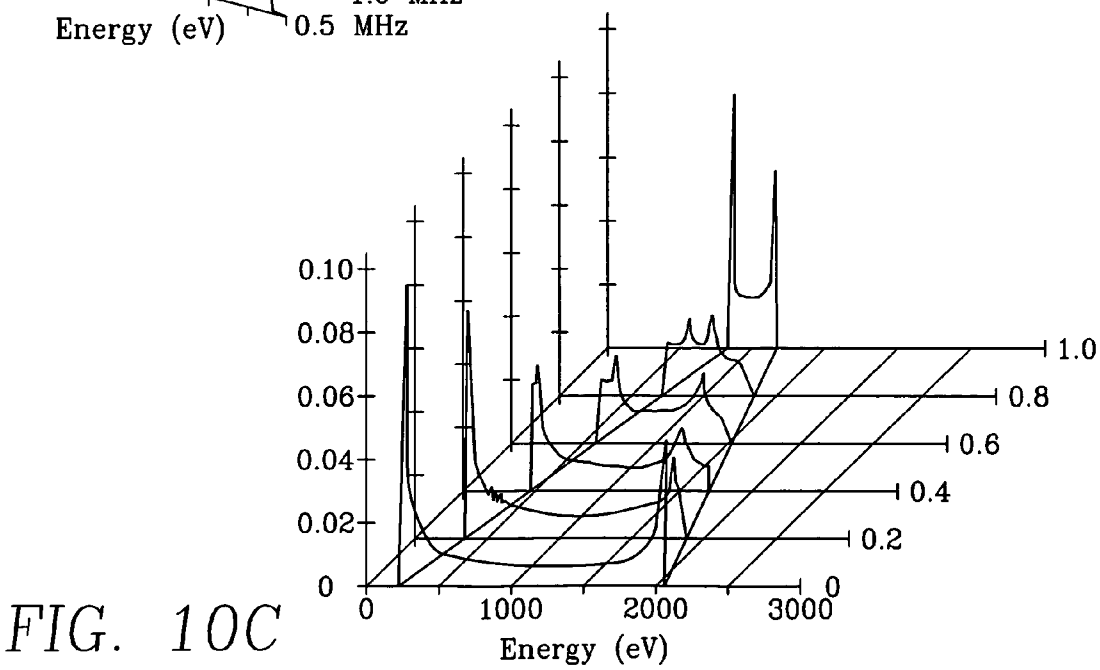
FIG. 10C is a graph comparing ion energy distributions obtained with dual frequency bias sources for different power ratios of the two frequencies.

FIG. 10A is a graph comparing the RF power contributing to ion density with the power contributing to ion energy as a function of frequency in a plasma reactor. The graph indicates that there are three principal frequency ranges: from 0 to about 13 MHz, nearly all the RF power contributes to plasma ion energy. From about 13 MHz to about 65 MHz, the power is divided between contributing to ion energy and contributing to ion density. Above about 65 MHz, nearly all the RF power contributes to ion density. The contributions to ion energy at and slightly below 13 MHz produce a narrow ion energy distribution centered at the peak-to-peak RF voltage. This ion energy distribution widens as the RF frequency is reduced to or below the ion transit frequency, the highest frequency at which ions in the sheath can follow the RF oscillations. The ion energy distribution has maximum width at the low frequency of 2 MHz. These effects are depicted in FIG. 10B, which is a graph comparing ion energy distributions obtained at different RF bias power frequencies for a single RF bias source. FIG. 10B shows that the widest ion energy distribution is obtained at the lowest frequency (2 MHz) and the narrowest is obtained at the highest frequency (13 MHz). By mixing both a high and a low frequency, the energy distribution may be skewed toward a higher energy, as shown in FIG. 10C, which is a graph comparing ion energy distributions obtained with dual frequency bias sources for different power ratios of the two frequencies. The higher population peak is at an ion energy corresponding to the peak-to-peak voltage of the middle or high frequency (e.g., 13 MHz) source. The second higher population peak corresponds to the lower frequency (e.g., 2 MHz) power. In accordance with a preferred embodiment of the present invention, the ion energy distribution is adjusted to increase or decrease the high energy ion population relative to the lower energy ion population by adjusting the ratio between the power levels of the low frequency (e.g., 2 MHz) power and the medium or high frequency (e.g., 13 MHz) power source. The comparison of FIG. 10C shows that the low frequency (e.g., 2 MHz) RF power contributes more to the ion population at higher energies, and that the converse is true for the high frequency (e.g., 13 MHz) RF power. Thus, the width of the ion energy distribution and its high frequency content is enhanced by increasing the ratio of low frequency power to high frequency power. Moreover, FIG. 10C shows that as the HF (e.g., 13 MHz) power approaches zero, the predominant peak shifts to an ever higher frequency. Therefore, the ion energy distribution is selected by adjusting the ratio between the low frequency and high frequency power levels.

Figure 11A:
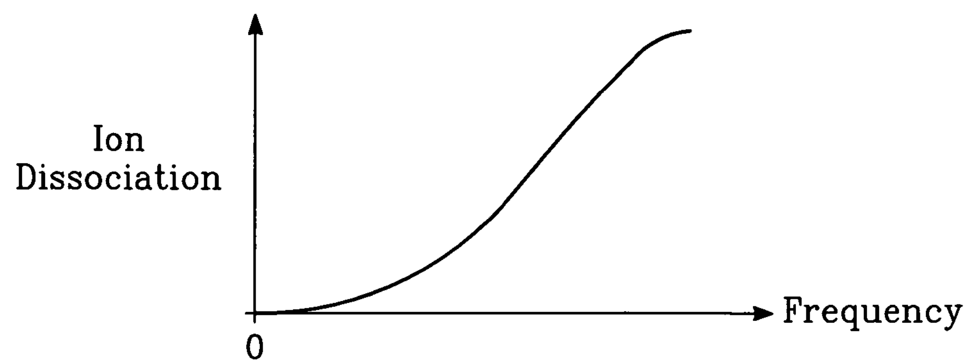
FIGS. 11A and 11B are graphs comparing behaviors of ion dissociation and ion density as functions of frequency.
Figure 11B:
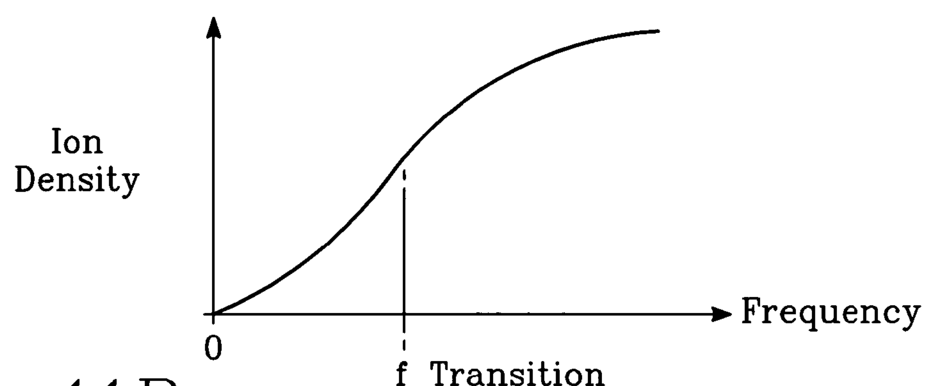

The control of dissociation and ion density is provided by adjusting the power levels of respective sources having two different frequencies having different effects upon dissociation and density. The higher HF or lower VHF frequencies contribute significantly to ion density but contribute very little to ion dissociation. This is shown in FIGS. 11A and 11B, which are graphs comparing behaviors of ion dissociation and ion density as functions of frequency. Frequencies in a lower range (up to f transition of FIG. 11B) greatly affect ion density (FIG. 11B) but have little effect upon ion dissociation (FIG. 11A). The frequency ("f transition") bounding the two ranges is generally a VHF frequency whose value depends upon various process parameters, but may be on the order of about 100 MHz.

Figure 12:
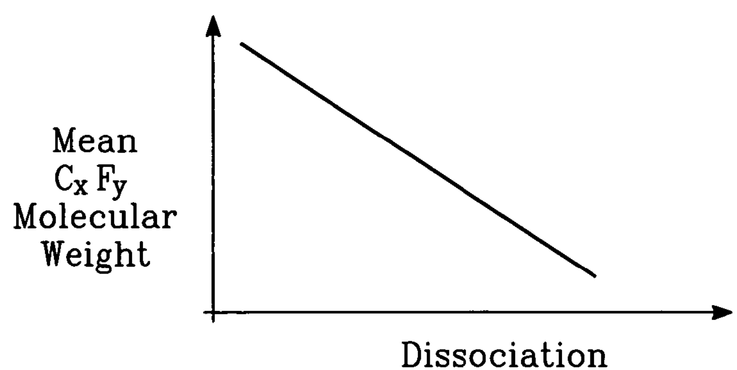
FIG. 12 is a graph depicting the mean fluorocarbon molecular weight in a plasma containing a fluorocarbon gas as a function of ion dissociation.
Figure 13:
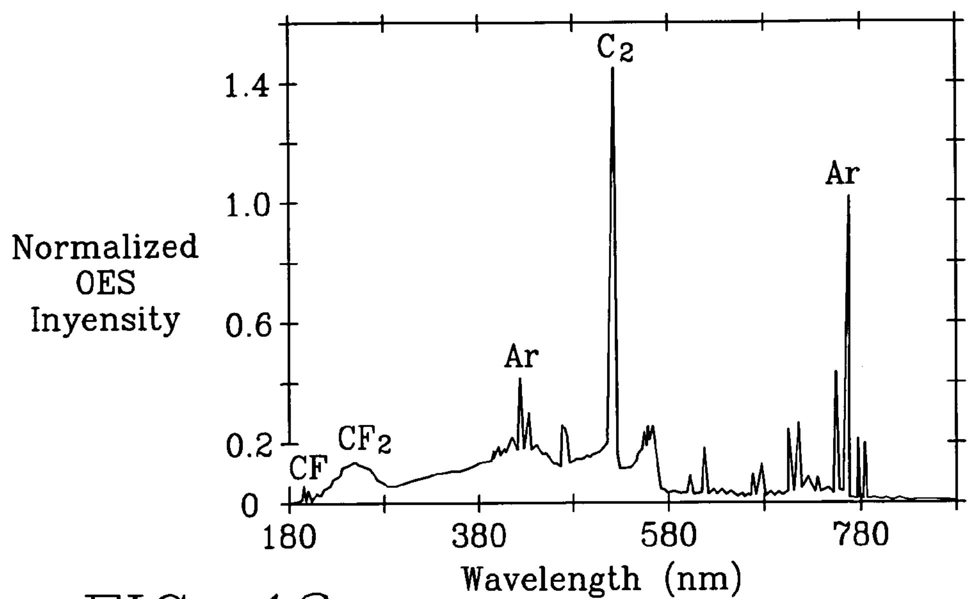
FIG. 13 is a graph comparing molecular weight distribution in a plasma at low ion dissociation and high ion dissociation.
Figure 14:
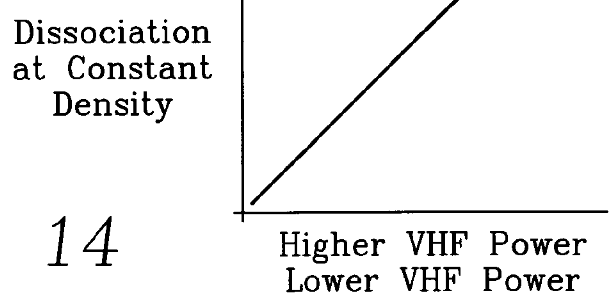
FIG. 14 is a graph depicting the behavior of ion dissociation as a function the power ratio between two different source power frequencies.
Figure 15:
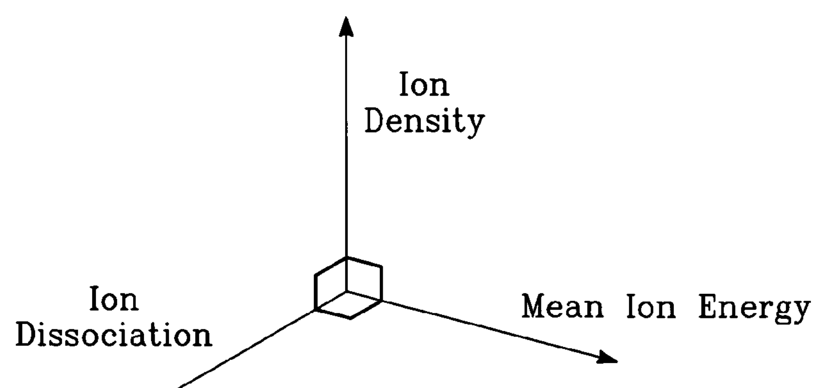
FIG. 15 illustrates a three-dimensional control space in which ion dissociation, ion density and ion energy are three independent (orthogonal) control dimensions defining the space.

FIG. 12 is a graph depicting the mean fluorocarbon molecular weight in a plasma containing a fluorocarbon gas as a function of ion dissociation. This illustrates one way of quantifying dissociation, and that is the average or mean molecular weight of a certain class of molecules (e.g., fluorocarbon molecules) in the plasma. The lower the molecular weight, the greater the degree of dissociation. This concept reflects the results of optical emission spectra (OES) data represented by FIG. 13, which is a graph comparing molecular weight distribution in a plasma at low ion dissociation and high ion dissociation. At lower dissociation, the population peaks coincide with more complex molecules, while the reverse is true for higher dissociation. Applying the results of FIGS. 11A and 11B to a two-source frequency system, the dissociation and density of a plasma can be controlled separately by controlling the ratio between the power levels of the higher and lower frequency source power generators (both of which may be VHF generators). This is depicted in FIG. 14, which is a graph depicting the behavior of ion dissociation as a function the power ratio between two different source power frequencies. Using the three-frequency approach of FIG. 1 or the four-frequency approach of FIGS. 2-5, a three-dimensional control space is realized along three independent (i.e., orthogonal) axes representing ion energy, ion density and ion dissociation. FIG. 15 illustrates such a three-dimensional control space in which ion dissociation in the bulk plasma, ion density in the bulk plasma and ion energy in the plasma sheath are three independent (orthogonal) dimensions defining the control space.

Preferably, then, the frequencies of the two generators 40*a*, 150 of FIG. 1 controlling ion density and ion dissociation lie on either side of f transition. Or, if they lie on the same side, then they are sufficiently different from one another so that one of them influences ion dissociation more than the other. The one influencing primarily ion density is the lower VHF frequency and the one influencing ion dissociation and density is the upper VHF frequency. These upper and lower VHF frequencies may or may not lie above and below (respectively) "f transition". As a result, by separately controlling the two frequencies, different values of ion density and ion dissociation may be selected at least nearly independently. The same is true of the two frequencies of the generators 150, 150' of FIGS. 4 and 5. The two frequencies must differ from one another sufficiently so that one affects ion dissociation more than the other. And, it is preferable (but not necessary) for the two frequencies to lie on opposite sides of f transition of FIGS. 11A and 11B.

Figure 16:
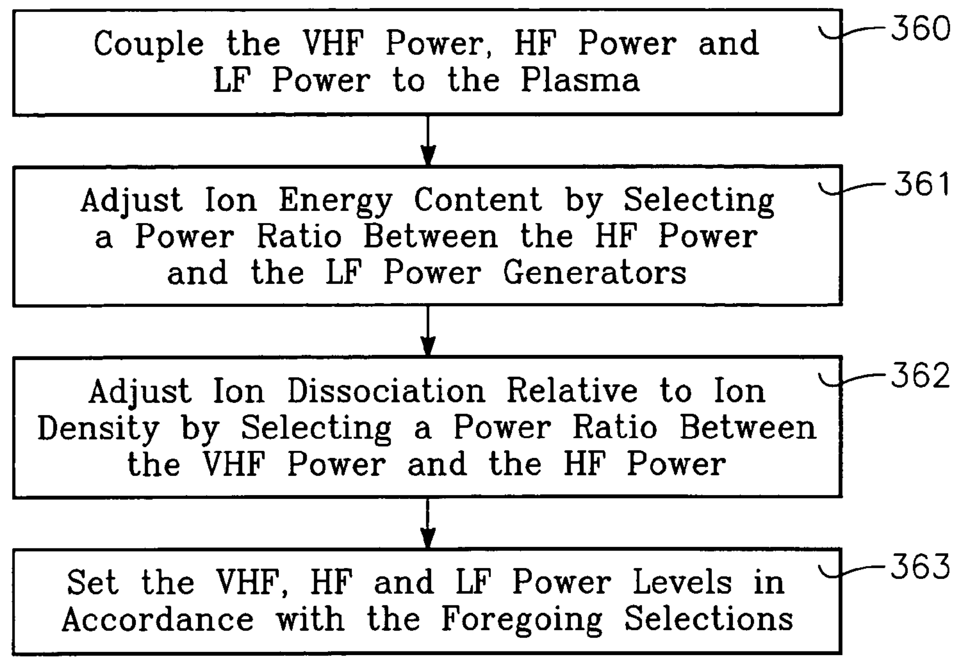
FIG. 16 depicts a first method for independently controlling ion energy distribution, ion density and ion dissociation using three RF power sources of different frequencies.

FIG. 16 depicts a first method for separately controlling ion energy distribution, ion density and ion dissociation using three RF power sources of different frequencies in a plasma reactor having three RF sources consisting of LF, HF and VHF frequencies sources, such as the reactor of FIG. 1. The method depends upon simultaneously applying VHF power, HF power and LF power to the plasma (block 360 of FIG. 16). The ion energy content is adjusted (either to widen the ion energy distribution or to move the mean energy of the distribution peak or both) relative to ion density (e.g., ion density may be kept constant if desired) by selecting a power ratio between the HF power source and the LF power source (block 361 of FIG. 16) within a continuous range of ratios corresponding to discrete or continuous ranges or continuums of power levels to which each of the two generators may be adjusted or set (e.g., the HF and LF generators 40*a*, 40*b* of FIG. 1). The ion dissociation is adjusted relative to the ion density by selecting a power ratio between the VHF power source—e.g., generator 150 of FIG. 1—and the HF power source—e.g., generator 40*b* of FIG. 1—(block 362). For example, ion density may be adjusted relative to dissociation by adjusting only the HF power level. Or, dissociation may be adjusted while maintaining a constant density by adjusting the VHF power level to adjust dissociation while maintaining ion density at a constant level by making countervailing changes in the HF power level. This step (block 362) may be performed before or with the step of block 361 so as to not limit the choice of ion energy level or spread. The power levels of the LF, HF and VHF power sources are then set in accordance with the foregoing selections (block 363).

Figure 17:
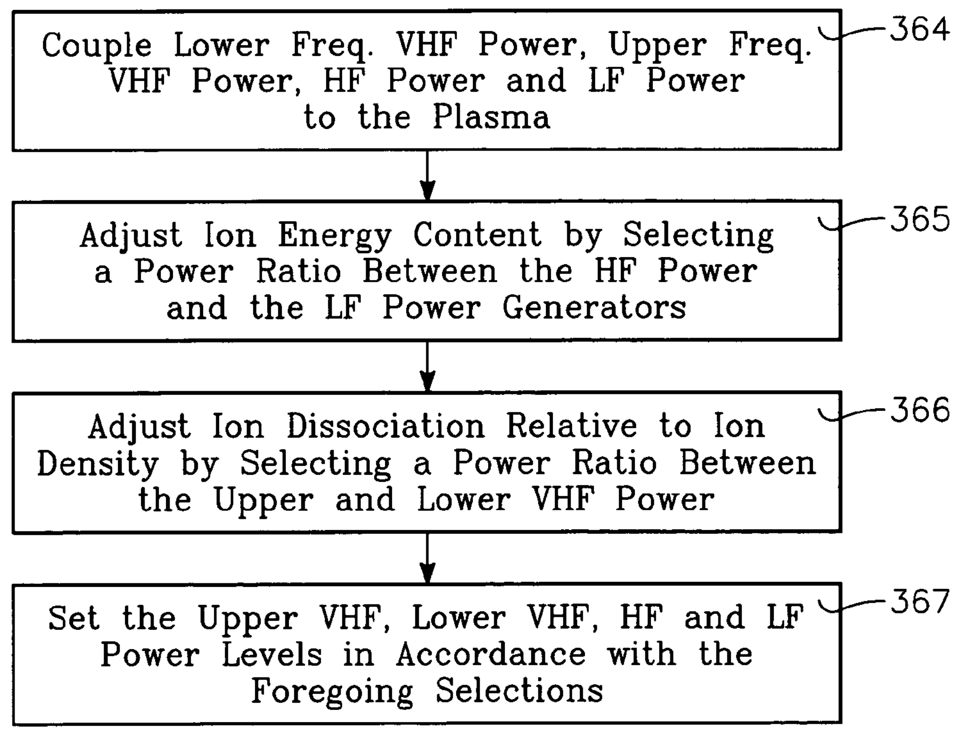
FIG. 17 depicts a second method for independently controlling ion energy distribution, ion density and ion dissociation using four RF power sources of different frequencies.

FIG. 17 depicts a second method for independently controlling ion energy distribution, ion density and ion dissociation using four RF power sources of different frequencies, in a plasma reactor of the type illustrated in FIG. 4, 5 6 or 9. While the following description of FIG. 17 refers to upper and lower VHF frequencies for independent control of density and dissociation, it is understood that the frequency that provides dissociation control in FIG. 6 or FIG. 9 is not necessarily an upper VHF frequency but may instead be an HF or LF frequency driving the inductive power applicator (FIG. 6) or driving the toroidal power applicator (FIG. 9).

In FIG. 17, four frequencies are simultaneously applied to the plasma, specifically (in the case of FIGS. 4 and 5) an LF frequency, an HF frequency, a lower VHF frequency and an upper VHF frequency (block 364). The ion energy content is adjusted (either to widen the ion energy distribution or to move the mean energy of the distribution peak or both) by selecting an appropriate power ratio between the HF power source and the LF power source (block 365 of FIG. 17) from a continuous range or continuum of such ratios. The ion dissociation is adjusted relative to the ion density by selecting a power ratio between the lower VHF power source and the upper VHF power source (block 366) from a range or continuum of such ratios. The power levels of the LF, HF, lower VHF and upper VHF power sources are then set in accordance with the foregoing selections (block 367).

FIG. 18 is a three-dimensional graph depicting the simultaneous behaviors of ion density and ion dissociation as functions of magnetic field strength. As indicated in FIG. 18, changing the strength of the magnetic field created by the coils 501, 502, 503, 504 of FIG. 2 changes only the plasma ion density and does not affect the ion dissociation appreciably. FIG. 19 is a three-dimensional graph depicting the simultaneous behaviors of ion density and ion dissociation as functions of VHF source power level. FIG. 19 indicates that changes in VHF power affect both ion density and ion dissociation. Therefore, by adjusting both VHF power and magnetic field strength, ion density and ion dissociation may be set at independently selected levels.

Figure 2:
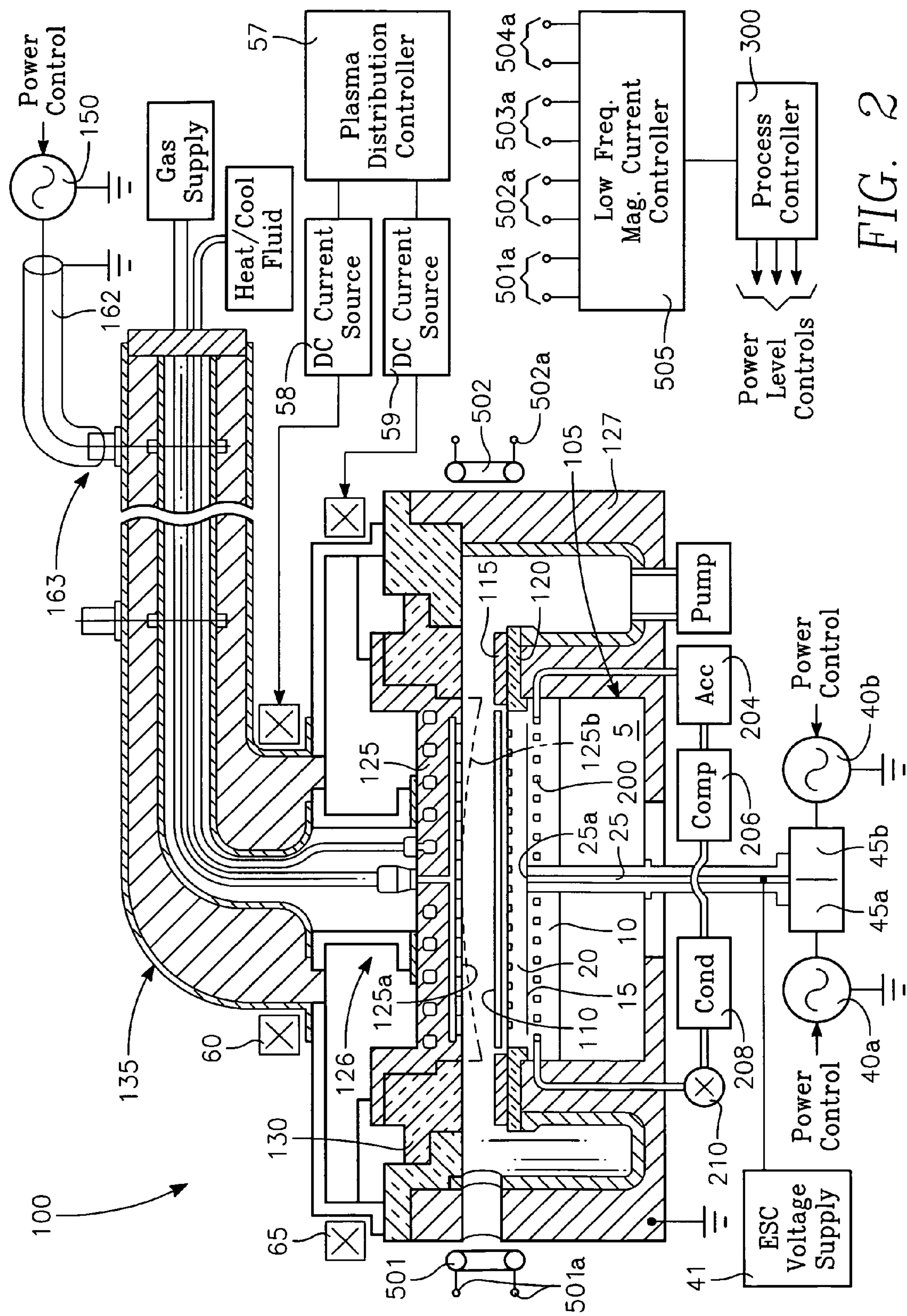
FIG. 2 illustrates an embodiment of FIG. 1 in which ion energy distribution is adjusted by controlling dual LF and HF bias power sources while ion density and ion dissociation are adjusted by controlling VHF source power level and magnetic field strength.
Figure 3:
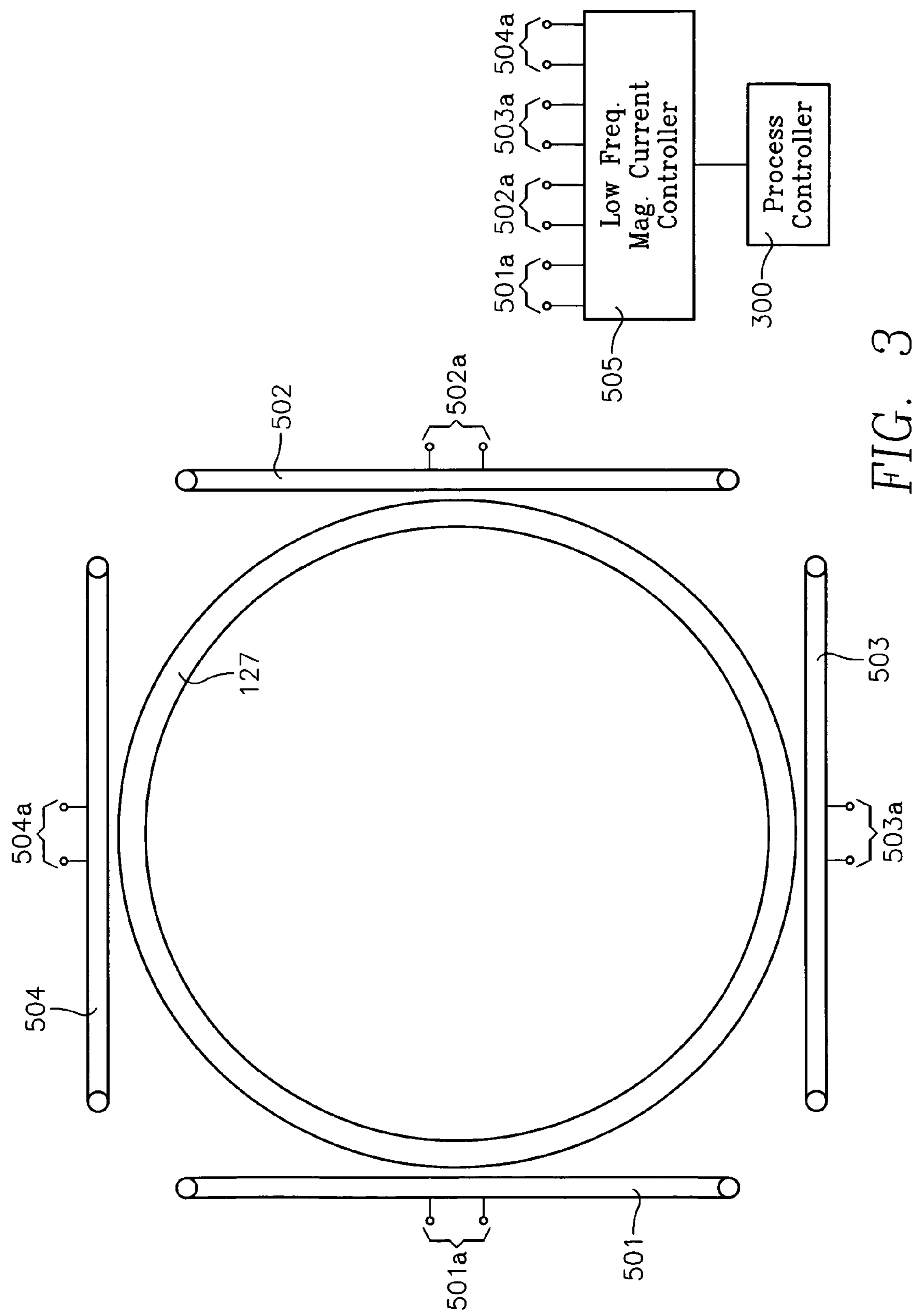
FIG. 3 is a top view corresponding to FIG. 2.

FIG. 20 depicts a method of independently controlling ion energy distribution, ion density and ion dissociation in a reactor of the type having pair of RF bias power sources, a VHF power source and a magnetic field source, such as the reactor of FIG. 2. The method relies upon simultaneously applying a magnetic field, VHF power HF power and LF power to the plasma (block 368 of FIG. 20). The ion energy content is adjusted (either to widen the ion energy distribution or to move the mean energy of the distribution peak or both) by selecting a power ratio between the HF power source and the LF power source (block 369). The ion dissociation is adjusted relative to the ion density by selecting a power level for the VHF power source and selecting a magnetic field strength to be provided by the magnetic field controller 505 of FIG. 2 (block 370). The power levels of the LF, HF and VHF power sources and the magnetic field strength of the controller 504 are then set in accordance with the foregoing selections (block 371).

While the invention has been described in detail by specific reference to preferred embodiments, it is understood that variations and modifications thereof may be made without departing from the true spirit and scope of the invention.

What is claimed is:

1. A method of processing a workpiece in a plasma reactor, comprising:

coupling RE power from three RE power sources of three respective frequencies and a magnetic field to plasma in said reactor, by:

(a) applying plasma source power of a VHF frequency of at least 60 MHz from a first one of said three RE power sources to a ceiling electrode of said plasma reactor;

(b) applying plasma bias power of a first bias frequency greater than an ion transit frequency of said plasma and less than said VHF frequency from a second one of said three RE power sources to a workpiece support electrode of said plasma reactor;

(c) applying plasma bias power of a second bias frequency less than said ion transit frequency of said plasma from a third one of said three RE power sources to said workpiece support electrode of said plasma reactor;

setting ion energy distribution shape by selecting a ratio between the power levels of said second and third ones of said three RF power sources; and setting ion dissociation and ion density by selecting a ratio between the power level of said first one of said three RF power sources and the strength of said magnetic field.

2. The method of claim 1 wherein said VHF frequency is 60 MHz or greater.

3. The method of claim 1 wherein said magnetic field has a frequency on the order of 10 Hz.

4. The method of claim 1 wherein the step of setting said ion energy distribution comprises adjusting the energy difference between a pair of peaks of the ion energy distribution.

5. The method of claim 1 wherein the step of setting said ion energy distribution comprises adjusting the ion population near one of a pair of peaks of the ion energy distribution relative to the other.

6. The method of claim 1 wherein the step of setting said ion energy distribution comprises adjusting the energy of one of a pair of peaks of the ion energy distribution.

* * * * *